(12) United States Patent
Pei

(10) Patent No.: US 6,203,337 B1
(45) Date of Patent: Mar. 20, 2001

(54) SOCKET CONNECTOR

(75) Inventor: Wen-Chun Pei, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/347,679

(22) Filed: Jul. 2, 1999

(30) Foreign Application Priority Data

Dec. 24, 1998 (TW) .................................. 87221547

(51) Int. Cl.⁷ .............................. H01R 12/00; H05K 1/00
(52) U.S. Cl. ............................................. 439/83; 439/259
(58) Field of Search .................................. 439/259, 266, 439/342, 83

(56) References Cited

U.S. PATENT DOCUMENTS

| | | | |
|---|---|---|---|
| 5,834,848 | * 11/1998 | Iwasaki | 361/767 |
| 5,880,590 | * 3/1999 | Desai et al. | 174/261 |
| 6,022,236 | * 8/1998 | Mchugh et al. | 439/342 |

* cited by examiner

Primary Examiner—Neil Abrams
Assistant Examiner—Javaid Nasri
(74) Attorney, Agent, or Firm—Wei Te Chung

(57) ABSTRACT

A socket connector includes a base defining first holes for receiving cylindrical pins therein and a cover fixed to the base for defining a space therebetween for movably receiving a slider. The cover defines second holes corresponding to the first holes of the base for receiving terminal pins of an electronic device therein. The slider defines slots corresponding to the holes for retaining contacts therein. Each contact engages with/separates from the corresponding pin of the base and the corresponding terminal pin for establishing/breaking electrical connection therebetween. The base is mounted to a substrate board having conductive traces formed thereon. A solder ball electrically connects each conductive trace to the corresponding pin of the base. The substrate board is made of a material having a thermal expansion coefficient identical to the circuit board thereby eliminating the possibility of rupturing the solder balls due to different thermal expansions of the boards. Each first hole has a conic opening for facilitating insertion of the corresponding pin therein and for accommodating solder to securely solder the pin to the substrate board.

6 Claims, 12 Drawing Sheets

SOCKET CONNECTOR

BACKGROUND OF THE INVENTION

1. Field of the Invention

The present invention generally relates to a socket connector, and in particular to a socket connector having ball grid array (BGA) contacts of which solder balls are effectively prevented from breaking due to different thermal expansions of the connector and a circuit board on which the connector is mounted.

2. The Prior Art

A socket connector connects an electronic device, such as a central processing unit module, to a circuit board. A ball grid array (BGA) configuration facilitates mounting the socket connector to a main circuit board. FIG. 1 of the attached drawings shows a portion of a conventional socket connector having BGA contacts. The socket connector comprises an insulative header 82 defining a plurality of through holes 820. Each through hole 820 receives a conductive pin 81 therein. The conductive pin 81 comprises a retention section 811 from which two opposite barbs 813 extend for engaging with side walls of the hole 820 thereby securing the pin 81 in the header 82. A soldering section 812 extends from the retention section 811 to which a solder ball 83 is attached. The solder ball 83 projects beyond a bottom surface of the header 82 for being soldered to a circuit board 9 to fix the connector thereto and establish electrical connection therewith.

Since the circuit board 9 and the header 82 are made of different material having different thermal expansion coefficients, when the solder balls 83 are soldered to the circuit board 9, the difference in expansion between the header 82 and the circuit board 9 may cause excessive strain in the solder balls 83 and eventually rupture the solder balls 83.

Furthermore, the pin 81 is soldered to the circuit board 9 with a very limited surface area resulting in a mechanically weak connection between the pin 81 and the circuit board 9. Furthermore, the pin 81 is made of a thin plate whereby the pin 81 is mechanically weak when resisting bending in a direction normal to the plate.

Thus, it is desired to provide a connector that eliminates the problems discussed above.

SUMMARY OF THE INVENTION

Accordingly, an object of the present invention is to provide a socket connector that prevents excessive strain from occurring in solder balls thereof when soldered to a circuit board.

Another object of the present invention is to provide a pin structure of a socket connector having a uniform mechanical strength for effectively resisting bending thereof.

A further object of the present invention is to provide a socket connector having pins securely soldered to a circuit board.

Yet a further object of the present invention is to provide a socket connector having pins readily inserted into holes defined therein and securely retained in the holes.

To achieve the above objects, a socket connector in accordance with the present invention comprises a base defining first holes for receiving cylindrical pins therein and a cover fixed to the base for defining a space therebetween for movably receiving a slider. The cover defines second holes corresponding to the first holes of the base for receiving terminal pins of an electronic device therein. The slider defines slots corresponding to the holes for retaining contacts therein. Each contact engages with/separates from the corresponding pin of the base and the corresponding terminal pin for establishing/breaking electrical connection therebetween. The base is mounted to a substrate board having conductive traces formed thereon. A solder ball electrically connects each conductive trace to the corresponding pin of the base. The substrate board is made of a material having a thermal expansion coefficient identical to the circuit board thereby eliminating the possibility of rupturing the solder balls due to different thermal expansions of the boards. Each first hole has a conic opening for facilitating insertion of the corresponding pin therein and for accommodating solder to securely solder the pin to the substrate board.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
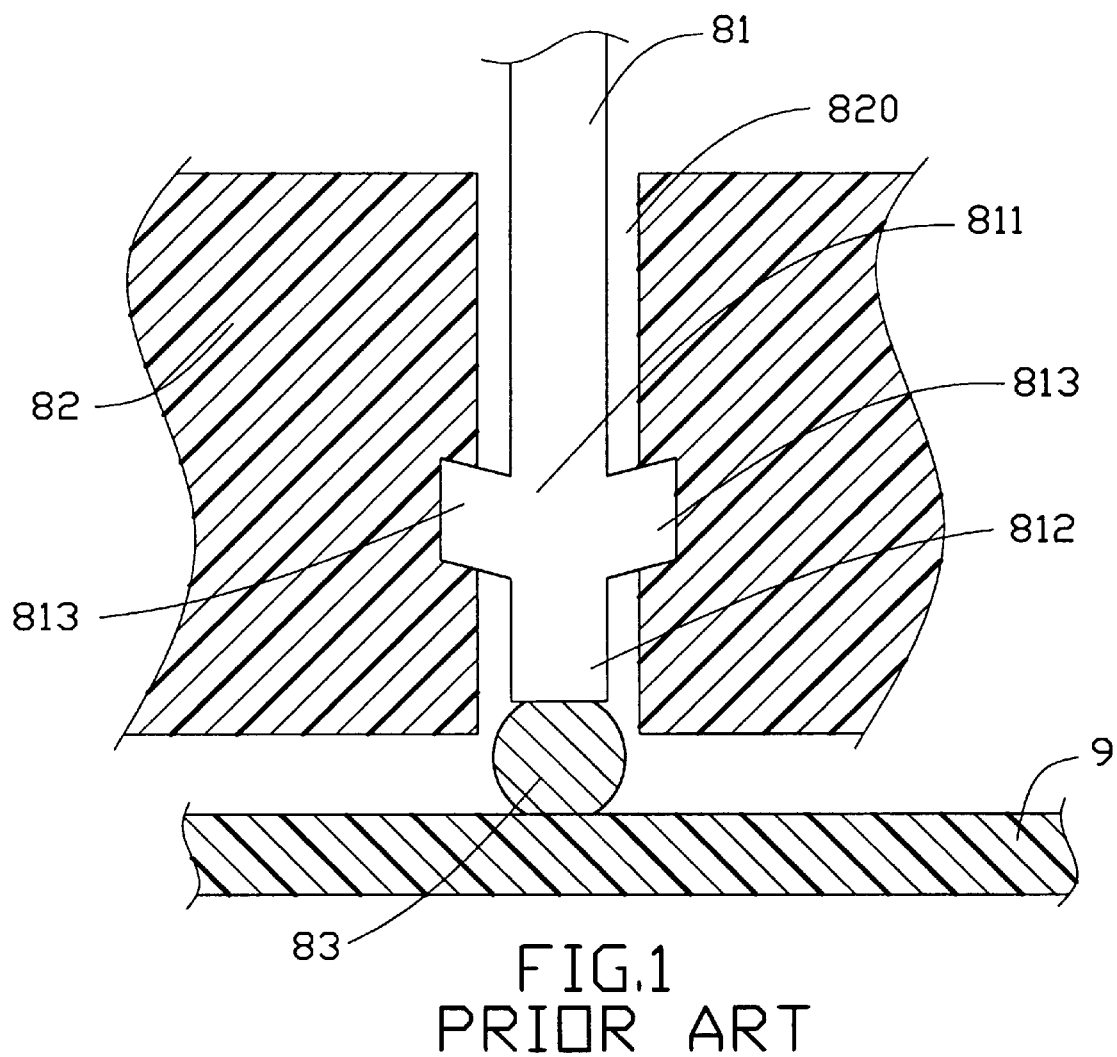
FIG. 1 is a partial cross-sectional view of a conventional socket connector.
Figure 2:
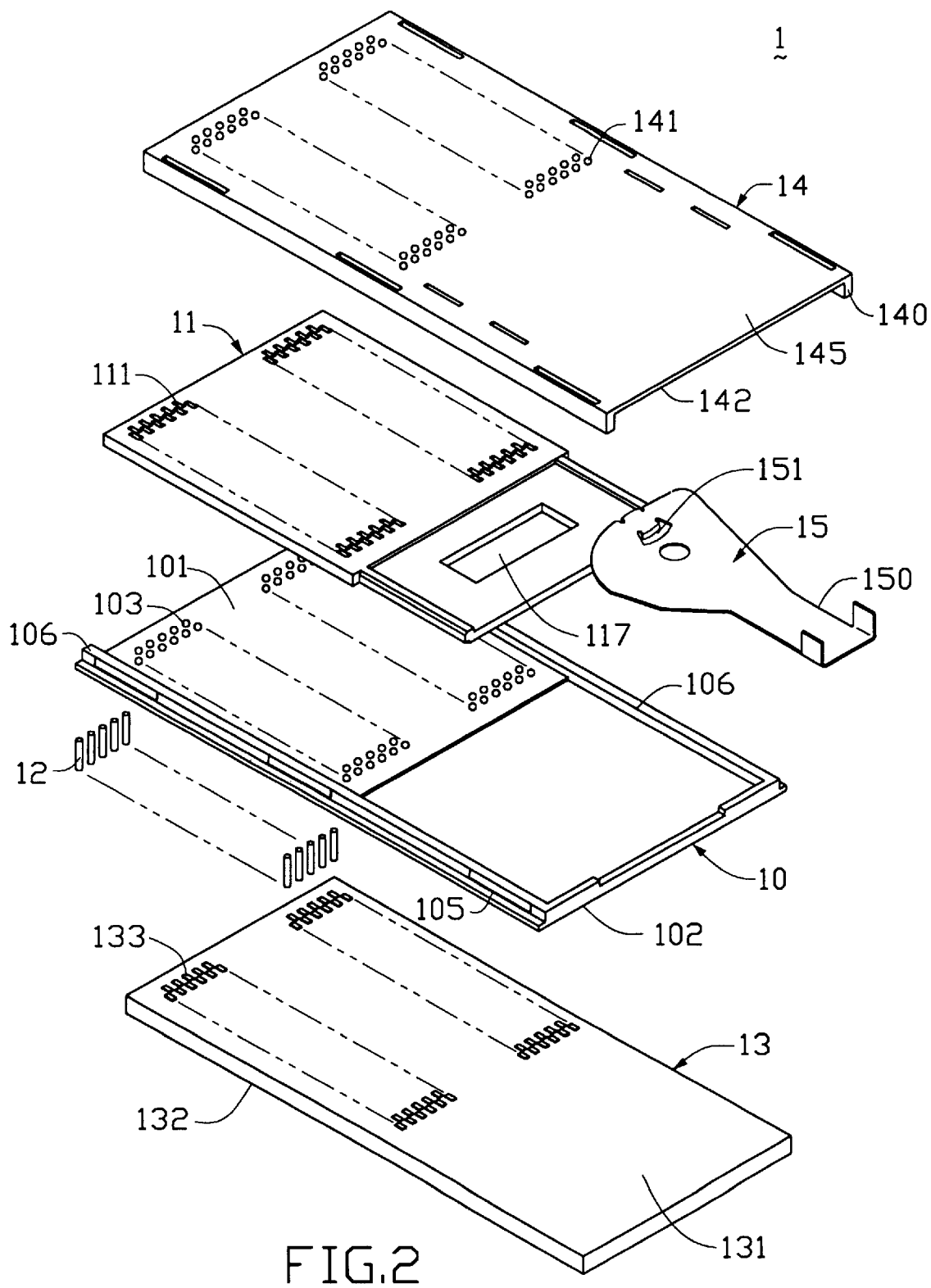
FIG. 2 is an exploded view of a socket connector in accordance with the present invention.
Figure 3:
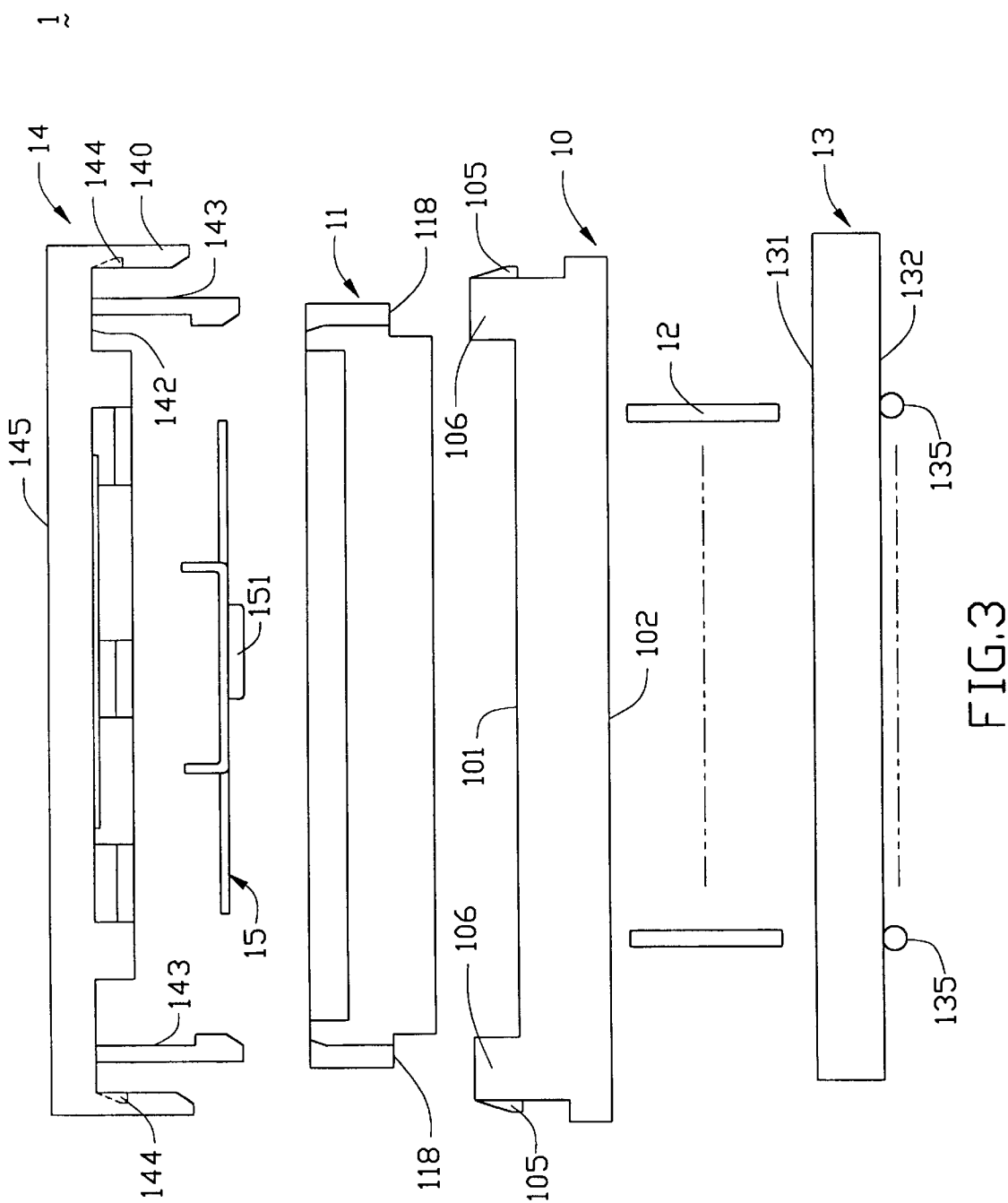
FIG. 3 is an exploded, side elevational view of the socket connector of the present invention.
Figure 5:
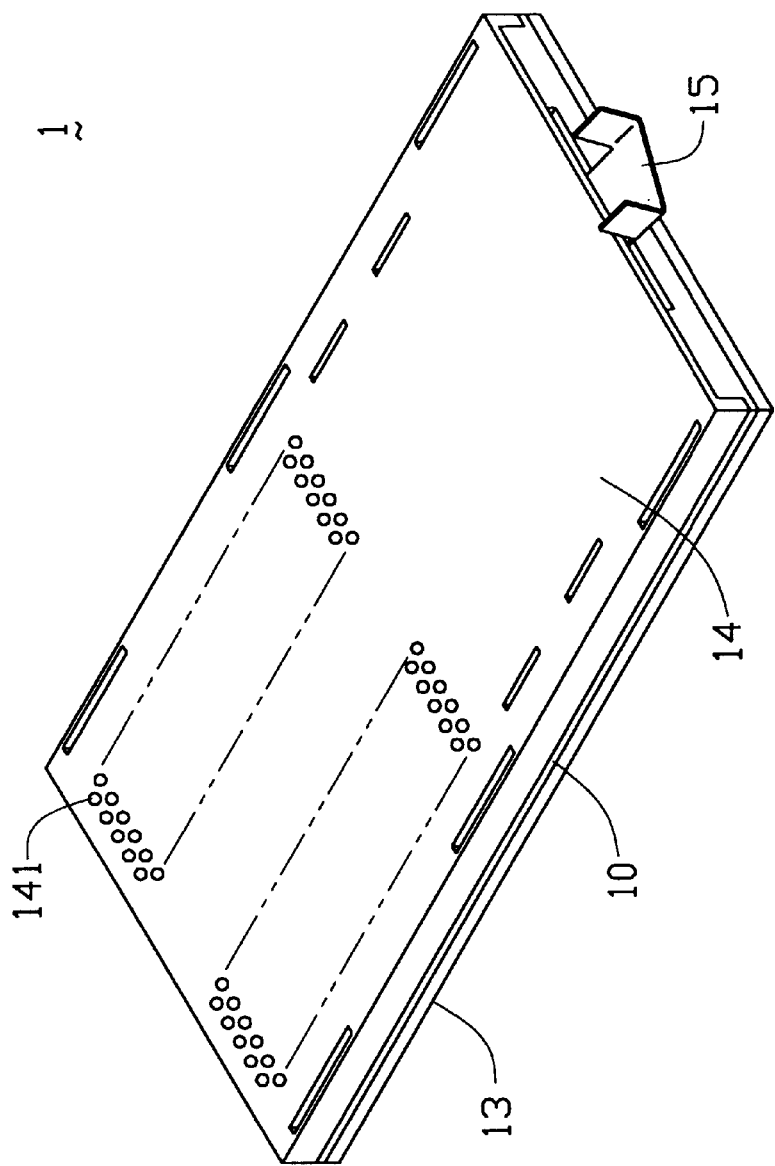
FIG. 5 is a perspective, assembled view of the socket connector of the present invention.

Referring to the drawings and in particular to FIGS. 2, 3 and 5, a socket connector 1 in accordance with the present invention comprises a base 10 and a cover 14 fixed to the base 10 defining an interior space (not labeled) therebetween for receiving a slider 11 therein. The base 10 is mounted to and supported on a substrate board 13 to be further described. The cover 14 has an outside face 145 for supporting an electronic device 2, such as a central processing unit module (FIG. 6), and an opposite inside face 142, and defines a plurality of through holes 141 between the outside and inside faces 145, 142 for receiving terminal pins 21 (FIG. 7) of the electronic device 2.

A driving member 15 is pivotally received in the interior space thereby being rotatable with respect to the cover 14. The driving member 15 has an end 150 extending beyond the cover 14 for handling purposes. A tab 151 is formed on the driving member 14 and movably received in a slot 117 defined in the slider 11 whereby rotation of the driving member 15 moves the slider 11 with respect to the cover 14 in a longitudinal direction.

The base 10 has a top face 101 on which two spaced walls 106 are formed for slidably guiding the movement of the slider 11. Each wall 106 forms a plurality of barbs 105. The cover 14 has two perpendicular flanges 140 extending from the inside face 142 thereof. Each flange 140 defines a plurality of recesses 144 corresponding to the barbs 105 of the base 10 for engaging therewith to secure the cover 14 to the base 10. The cover 14 further forms two latches 143 on the inside face 142 thereof for engaging with and movably supporting corresponding shoulders 118 formed on the slider 11.

Figure 4A:
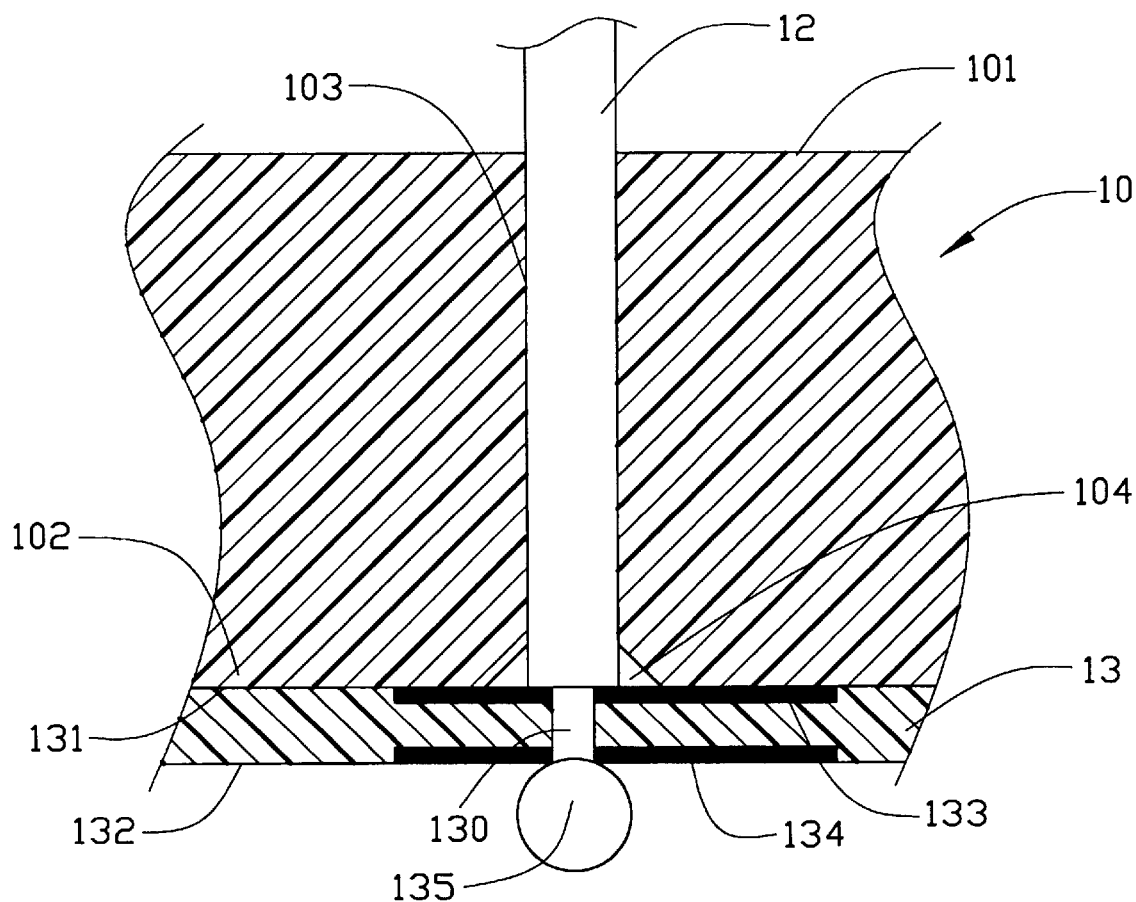
FIG. 4A is a partial cross-sectional view of the socket connector of the present invention.

As shown in FIGS. 2 and 4A, the base 10 has a bottom face 102 mounted to a top face 131 of the substrate board 13. A plurality of holes 103 corresponding to the through holes 141 of the cover 14 are defined in the base 10 between the top face 101 and the bottom face 102. Each hole 103 has a conic opening 104 formed in the bottom face 102 of the base 10 and receives a cylindrical board-engaging pin 12 therein. The board-engaging pin 12 provides a uniform mechanical strength for resisting bending from different directions. The conic opening 104 facilitates insertion of the board-engaging pin 12 into the corresponding hole 103. Furthermore, the conic opening 104 provides a space for accommodating solder (not shown) when soldering the board-engaging pin 12 to a corresponding top conductive trace 133 formed on the top face 131 of the substrate board 13. The conic opening 104 allows for a large contact area between the solder and the board-engaging pin 12 and between the solder and the top conductive trace 133 of the substrate board 13 thereby ensuring a secure connection between the board-engaging pin 12 and the substrate board 13.

Figure 4B:
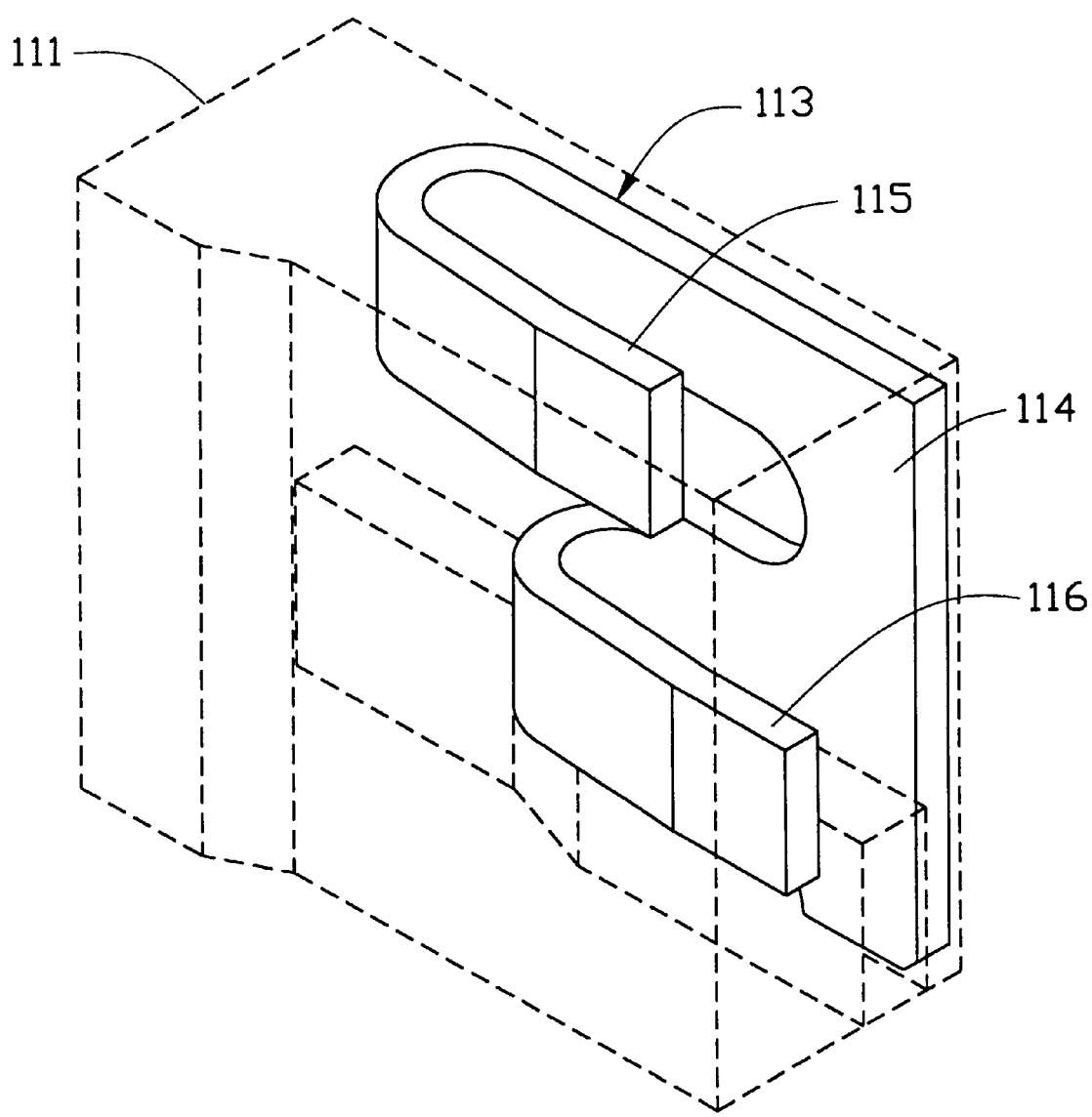
FIG. 4B is a perspective view of a contact element of the socket connector of the present invention received in a corresponding slot defined in a slider, the slot being shown in phantom lines.

Also referring to FIG. 4B, the slider 11 defines a plurality of slots 111 corresponding to the holes 103 of the base 10. Each slot 111 receives and retains a contact element 113. The contact element 113 has a base section 114 fixed to an inside face of the slot 111 and two U-shaped arms 115, 116 extending therefrom. The U-shaped configuration provides the arms 115, 116 with resiliency.

Figure 6:
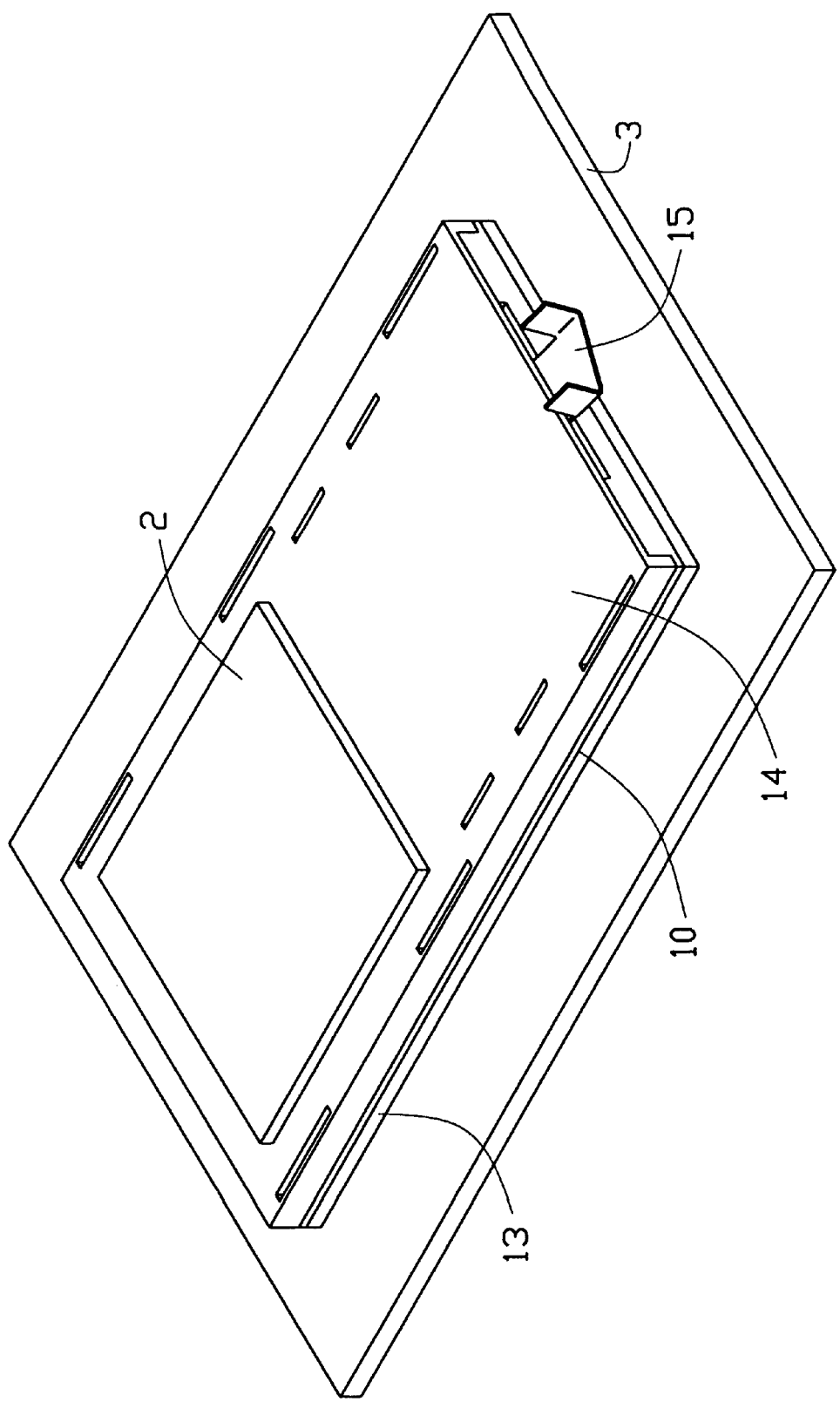
FIG. 6 is a perspective of the socket connector of the present invention connecting an electronic device to a main circuit board.

The substrate board 13 has a bottom face 132 adapted to be positioned on a circuit board 3 (FIG. 6). Bottom conductive traces 134 are formed on the bottom face 132 and are electrically connected to the top conductive traces 133 via holes 130. Each bottom trace 134 supports a solder ball 135 thereon for being soldered to a corresponding conductive pad (not shown) formed on the circuit board 3. The substrate board 13 is made of a material having a thermal expansion coefficient identical to the circuit board 3 or the same material as the circuit board 3 whereby a rise in temperature occurring when soldering the socket connector 1 to the circuit board 13 does not cause different thermal expansions on upper and lower portions of the solder ball thereby eliminating the possibility of rupturing the solder ball during the soldering process.

Figure 7:
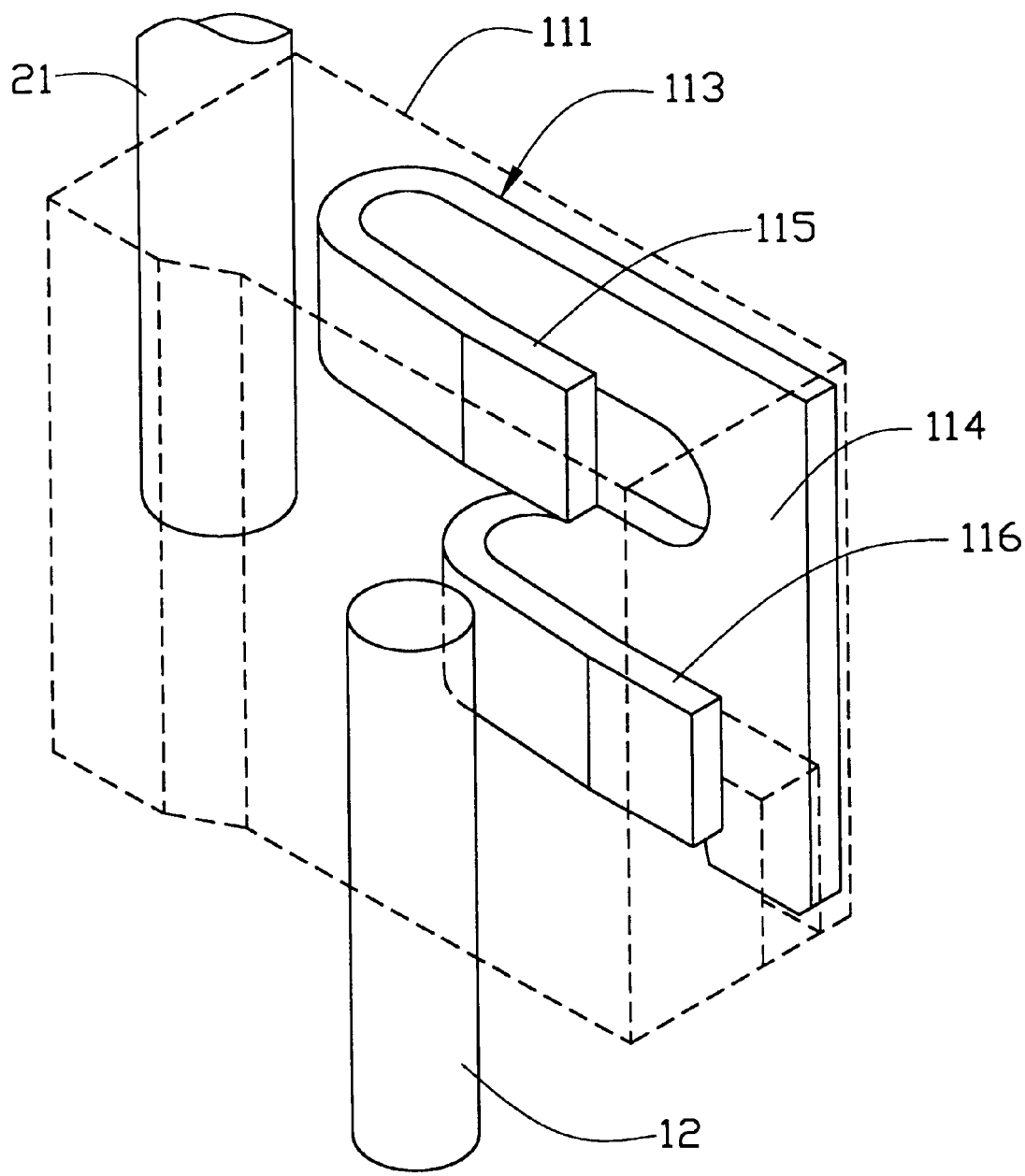
FIG. 7 is a perspective view of the contact element of the present invention showing the relationship thereof with a terminal pin of the electronic device and a board-engaging pin retained in a base of the socket connector, the slot in which the contact element is disposed being shown in phantom lines.

As shown in FIG. 7, each board-engaging pin 12 of the base 10 extends beyond the top face 101 thereof and partially projects into the corresponding slot 111 of the slider 11. The corresponding terminal pin 21 of the electronic device 2 also extends into the slot 111 and is spaced from the board-engaging pin 12 of the base 10. The pins 12, 21 respectively correspond to the two arms 116, 115 of the corresponding contact element 113 whereby when the slider 11 is moved by the driving member 15 with respect to the base 10 and the cover 14, the arms 116, 115 of the contact element 113 are engageable with/separable from the pins 12, 21 for forming/breaking electrical connection between the pins 12, 21. The resiliency of the arms 116, 115 ensures a secure engagement with the corresponding pin 12, 21.

Figure 8:
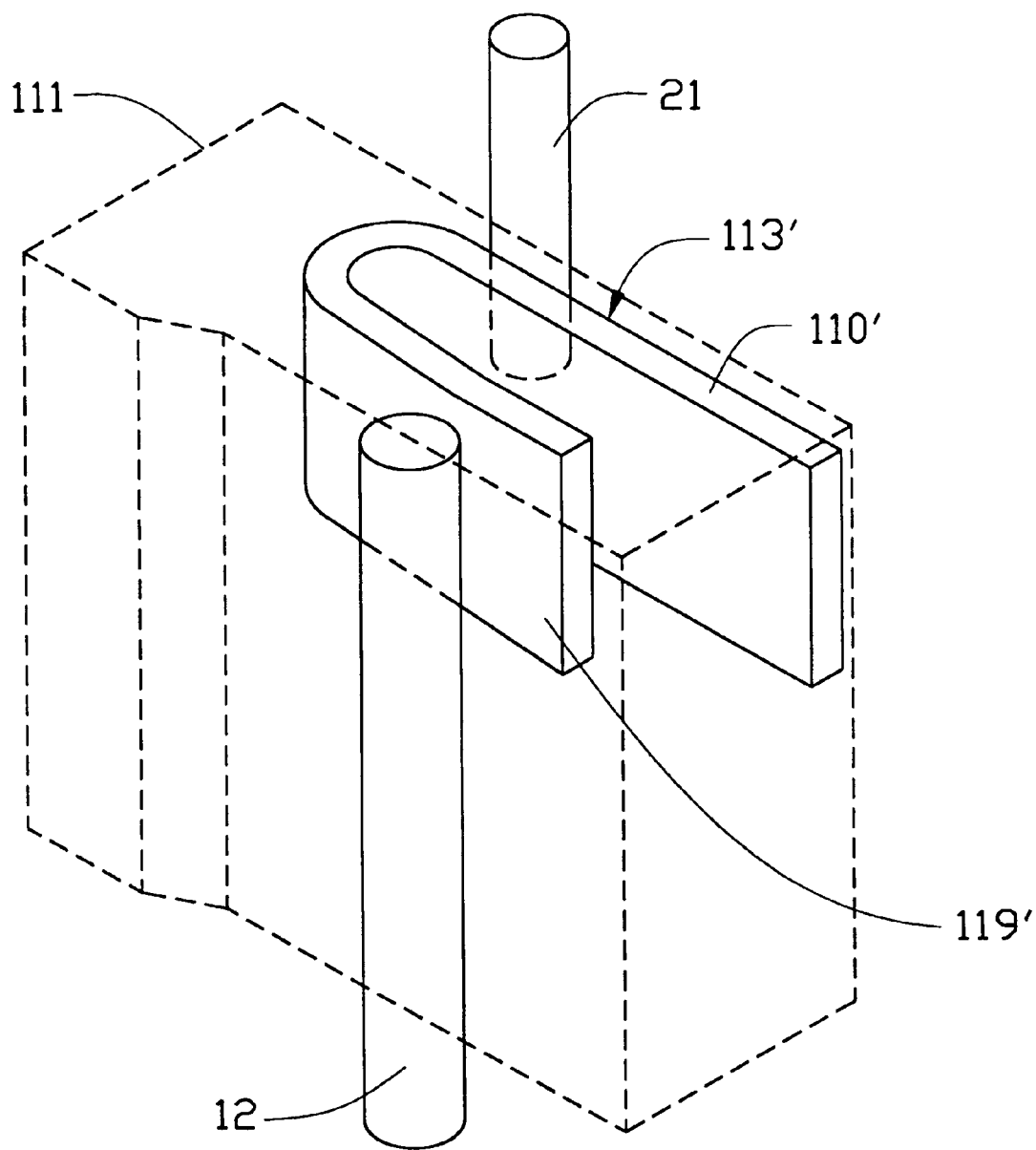
FIG. 8 is a perspective view of another embodiment of the contact element of the present invention showing the relationship thereof with a terminal pin of an electronic device and a board-engaging pin retained in a base of the socket connector, the slot in which the contact element is disposed being shown in phantom lines.
Figure 9:
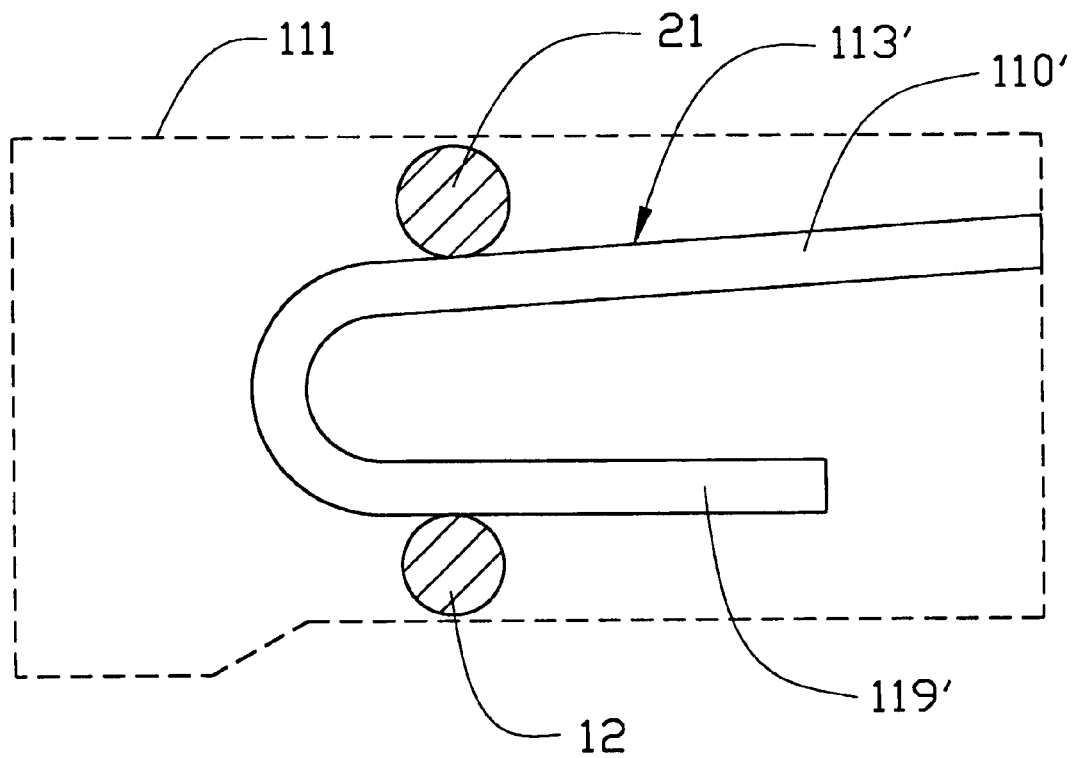
FIG. 9 is a top view of FIG. 8.

FIGS. 8 and 9 show another embodiment of the contact element which is designated by reference numeral 113' for distinction. The contact element 113' is retained in the corresponding slot 111 of the slider 11 and comprises a U-shaped structure having a first limb 110' which is partially fixed in the slot 111 and a second limb 119'. The first and second limbs 110', 119' are respectively engageable with/separable from circumferential surfaces of the board-engaging pin 12 of the base 10 and the terminal pin 21 of the electronic device 2 when the slider 11 is moved by the driving member 15.

Figure 10:
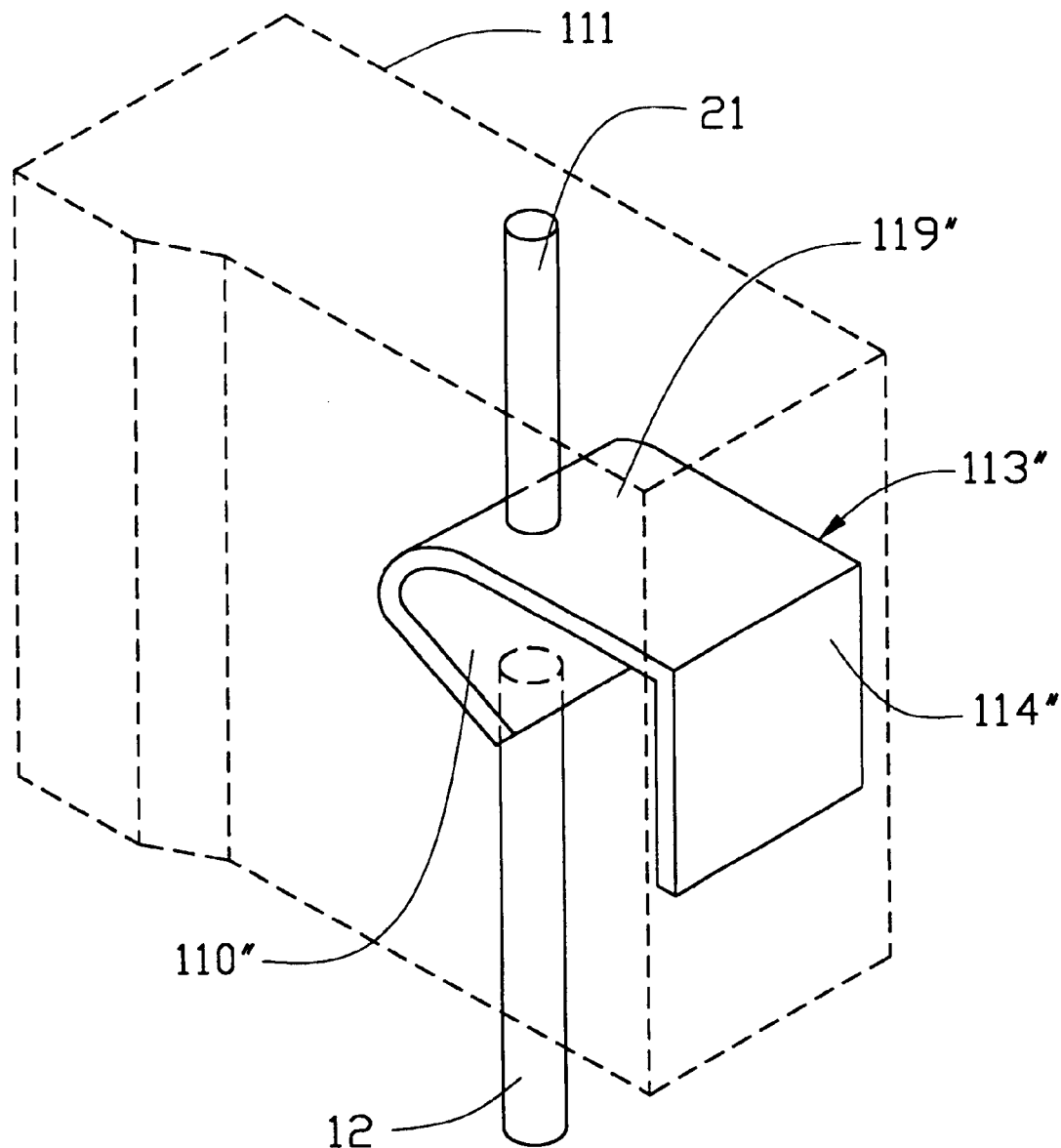
FIG. 10 is a perspective view of a further embodiment of the contact element of the present invention showing the relationship thereof with a terminal pin of an electronic device and a board-engaging pin retained in a base of the socket connector, the slot in which the contact element is arranged being shown in phantom lines.
Figure 11:
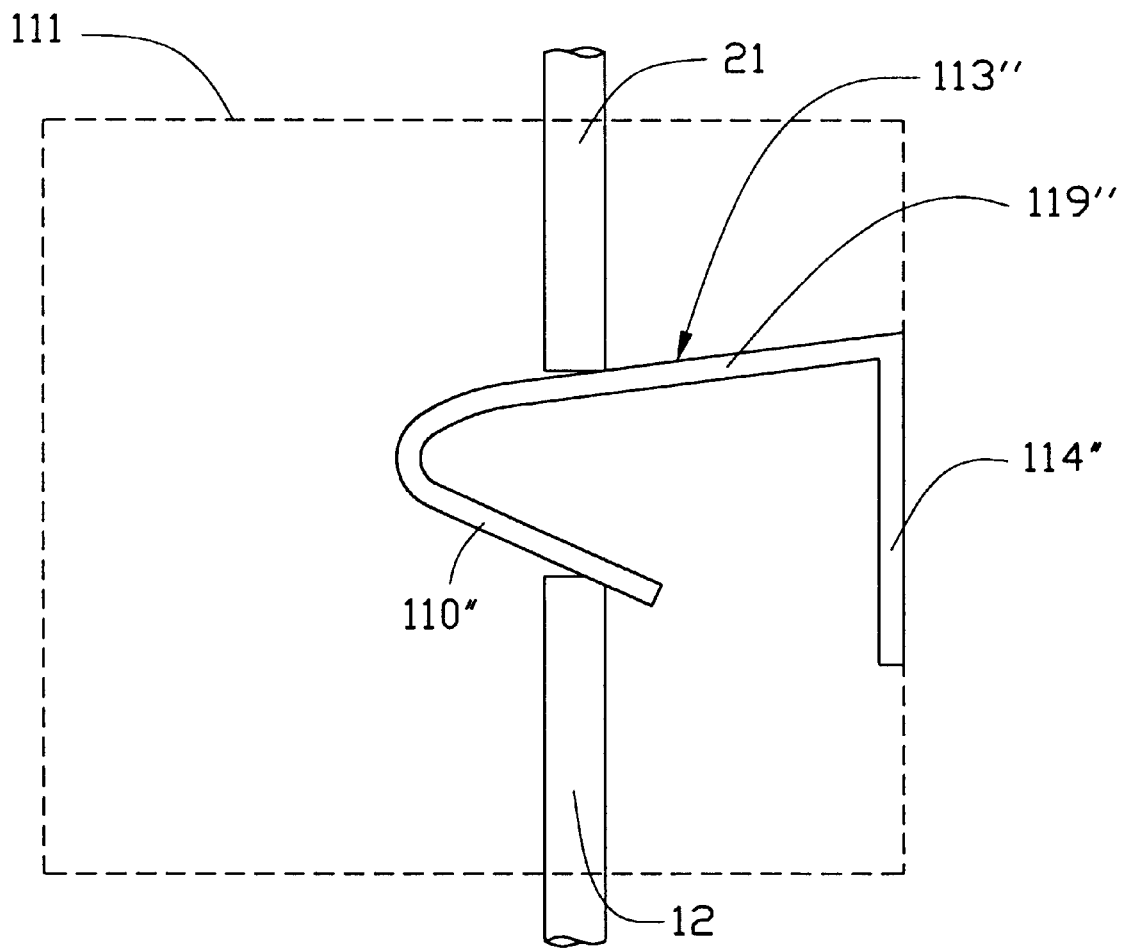
FIG. 11 is a side elevational view of FIG. 10.

FIGS. 10 and 11 show a further embodiment of the contact element which is designated by reference numeral 113" for distinction. Each contact element 113" is retained in the corresponding slot 111 of the slider 11 by means of a base section 114" fixed to an inside face of the slot 111. A U-shaped extension having a first limb 110" and a second limb 119" is formed extending from the base section 114". The board-engaging pin 12 of the base 10 and the terminal pin 21 of the electronic device 2 are partially received in the slot 111 and are substantially aligned with each other but axially spaced from each other thereby defining a gap therebetween. The limbs 110", 119" of the contact element 113" are respectively engageable with/separable from ends of the pins 12, 21 for forming/breaking electrical connection therebetween when the slider 11 is moved.

Although the present invention has been described with reference to the preferred embodiments, it is apparent to those skilled in the art that a variety of modifications and changes may be made without departing from the scope of the present invention which is intended to be defined by the appended claims.

What is claimed is:

1. A socket connector adapted to connect an electronic device to a circuit board, the circuit board having a thermal expansion coefficient, the socket connector comprising:

a base having a bottom face and a top face and defining a plurality of first holes each receiving a board-engaging pin therein, each said board-engaging pin extending beyond the top face of the base;

a cover fixed to the base and defining an interior space therebetween, the cover defining a plurality of second holes corresponding to the first holes of the base and adapted to receive terminal pins of the electronic device, the terminal pins partially extending into the interior space;

a slider movably received in the interior space between the base and the cover, a plurality of slots being defined in the slider corresponding to the first and second holes for partially receiving end sections of the corresponding board-engaging pins and terminal pins therein with each board-engaging pin and the corresponding terminal pin being spaced from each other, each slot receiving and retaining a conductive contact element therein, the contact element being movable with the slider for being selectively engageable with both the board-engaging pin and the terminal pin thereby forming electrical connection therebetween; and a substrate board made of a material having the same thermal expansion coefficient as the circuit board, the substrate board having a top face to which the bottom face of the base is mounted and a bottom face, a number of top conductive traces being formed on the top face of the substrate board and soldered to the corresponding board-engaging pins, a number of bottom conductive traces being formed on the bottom face of the substrate board and electrically connected to the corresponding top conductive trace, each bottom trace being adapted to support and electrically connect a solder ball; wherein.

a hole is defined in the substrate board for electrically connecting each top conductive trace to the corresponding bottom conductive trace; wherein each first hole comprises an enlarged opening formed in the bottom face of the base, the enlarged opening being adapted to facilitate insertion of the corresponding board-engaging pin therein and adapted to accommodate solder therein for soldering the board-engaging pin to the corresponding top conductive trace of the substrate board; wherein the enlarged opening has a conic configuration.

2. The socket connector as claimed in claim 1, wherein the board-engaging pin has a cylindrical configuration.

3. The socket connector as claimed in claim 1, wherein each contact element comprises a base section fixed to an inside face of the corresponding slot and two resilient arms respectively engageable with the board-engaging pin and the terminal pin for establishing electrical connection therebetween.

4. The socket connector as claimed in claim 3, wherein each resilient arm of the contact element has a U-shaped section.

5. The socket connector as claimed in claim 1, wherein each contact element has a U-shaped configuration having two limbs respectively engageable with circumferential surfaces of the board-engaging pin and the terminal pin.

6. The socket connector as claimed in claim 1, wherein each contact element has a base section fixed to an inside face of the corresponding slot and a U-shaped extension having two limbs respectively engageable with end faces of the board-engaging pin and the terminal pin.

* * * * *